(12) United States Patent
Choi et al.

(10) Patent No.: US 9,997,596 B2
(45) Date of Patent: Jun. 12, 2018

(54) TUNNELING FIELD-EFFECT TRANSISTOR WITH A PLURALITY OF NANO-WIRES AND FABRICATION METHOD THEREOF

(71) Applicant: Korea Advanced Institute of Science And Technology, Daejeon (KR)

(72) Inventors: Yang-Kyu Choi, Daejeon (KR); Jun-Young Park, Daejeon (KR)

(73) Assignee: Korea Advanced Institute of Science and Technology, Daejeon (KR)

(*) Notice: Subject to any disclaimer, the term of this patent is extended or adjusted under 35 U.S.C. 154(b) by 0 days. days.

(21) Appl. No.: 15/041,559

(22) Filed: Feb. 11, 2016

(65) Prior Publication Data
US 2017/0194428 A1    Jul. 6, 2017

(30) Foreign Application Priority Data

Dec. 30, 2015 (KR) ........................ 10-2015-0189480

(51) Int. Cl.
| | |
|---|---|
| *H01L 29/06* | (2006.01) |
| *H01L 21/02* | (2006.01) |
| *H01L 21/266* | (2006.01) |
| *H01L 21/308* | (2006.01) |
| *H01L 29/66* | (2006.01) |
| *H01L 21/306* | (2006.01) |
| *H01L 29/423* | (2006.01) |

(52) U.S. Cl.
CPC .... *H01L 29/0673* (2013.01); *H01L 21/02694* (2013.01); *H01L 21/266* (2013.01); *H01L 21/3081* (2013.01); *H01L 29/66568* (2013.01); *H01L 21/30604* (2013.01); *H01L 29/42392* (2013.01)

(58) Field of Classification Search
CPC .......... H01L 21/02603; H01L 29/0669; H01L 29/0673; H01L 29/413; H01L 29/41725; H01L 2221/1094
See application file for complete search history.

(56) References Cited

U.S. PATENT DOCUMENTS

| | | | |
|---|---|---|---|
| 9,379,182 B1 * | 6/2016 | Chen | H01L 29/0673 |
| 2009/0283823 A1 * | 11/2009 | Izumi | H01L 29/1095 |
| | | | 257/332 |
| 2014/0220748 A1 * | 8/2014 | Huang | H01L 21/823892 |
| | | | 438/232 |
| 2016/0020305 A1 * | 1/2016 | Obradovic | H01L 29/7391 |
| | | | 257/39 |
| 2016/0071931 A1 * | 3/2016 | Cheng | H01L 21/0245 |
| | | | 257/329 |
| 2016/0225849 A1 * | 8/2016 | Wong | H01L 29/0673 |

* cited by examiner

*Primary Examiner* — Jesse Y Miyoshi
*Assistant Examiner* — David Spalla
(74) *Attorney, Agent, or Firm* — Foley & Lardner LLP

(57) ABSTRACT

A tunneling field-effect transistor may be provided that includes: a substrate; a source which is formed on the substrate and into which p+ type impurity ion is injected; a drain which is formed on the substrate and into which n+ type impurity ion is injected; a plurality of vertically stacked nanowire channels which are formed on the substrate; a gate insulation layer which is formed on the plurality of nanowire channels; and a gate which is formed on the gate insulation layer. As a result, it is possible to generate a higher driving current without changing the length of the gate and the area of the channel (degree of integration).

5 Claims, 18 Drawing Sheets

OFF STATE

ON STATE

OFF STATE

ON STATE

TUNNELING FIELD-EFFECT TRANSISTOR WITH A PLURALITY OF NANO-WIRES AND FABRICATION METHOD THEREOF

CROSS-REFERENCE TO RELATED PATENT APPLICATIONS

The present application claims the benefit of Korean Patent Application Serial No. 10-2015-0189480 filed on Dec. 30, 2015; the entireties of which are all incorporated herein by reference.

BACKGROUND

Field

The present invention relates to a tunneling field-effect transistor and a fabrication method thereof, and more particularly to a tunneling field-effect transistor having a plurality of vertically stacked nanowires and a fabrication method thereof.

Description of the Related Art

A semiconductor technology based on a channel formed by a gate voltage and a metal oxide semiconductor field effect transistor (hereinafter, referred to as MOSFET) which is driven in the form of carriers drifting by a drain voltage has developed innovatively.

Recently, researches are actively being devoted to a tunneling field-effect transistor (hereinafter, referred to as TFET) using tunneling between bands. The TFET is driven by a tunneling of carriers, based on energy band characteristics caused by the gate voltage and the drain voltage. Compared with the MOSFET, the TFET has a superb sub-threshold slope (SS) characteristic. This is an indicator to evaluate the performance of the transistor as a switch. The less the value of the SS is, the less standby power the TFET consumes. While an existing MOSFET has 60 mV/dec, the TFET has a value less than 60 mV/dec.

However, unlike the MOSFET using a drift mechanism (FIGS. 14A and 14B), the TFET using a tunneling mechanism (FIGS. 15A and 15B) has a limitation of having a low driving current. The driving current is related to the operating speed of the transistor. A higher driving current allows the transistor to perform a faster switch function.

One method for solving the low driving current of the TFET is to shorten the length of the gate. However, the shortened length of the gate of the TFET brings about a new problem of a short channel effect.

Another method for solving the low driving current of the TFET is to increase a channel area of the TFET. This intends to increase the driving current by increasing the channel area. However, this method goes against a current trend in which the transistor becomes smaller and has a higher degree of integration of a semiconductor chip.

SUMMARY

One embodiment is a tunneling field-effect transistor which includes: a substrate; a source which is formed on the substrate and into which p+ type impurity ion is injected; a drain which is formed on the substrate and into which n+ type impurity ion is injected; a plurality of vertically stacked nanowire channels which are formed on the substrate; a gate insulation layer which is formed on the plurality of nanowire channels; and a gate which is formed on the gate insulation layer.

The substrate may be an intrinsic substrate.

Another embodiment is a method for manufacturing a tunneling field-effect transistor, which includes: (a) depositing a hard mask on a substrate; (b) forming a photoresist on the substrate and exposing the hard mask by patterning at least one portion of the photoresist; (c) etching the exposed hard mask and removing the photoresist; (d) patterning a channel on the substrate by using anisotropic etching; (e) forming a passivation layer on the substrate; (f) forming a nanowire on the substrate by using isotropic etching; (g) forming a plurality of the nanowires by repeatedly performing the steps (d) to (f); and (h) manufacturing the tunneling field-effect transistor including the plurality of the nanowires.

The step (h) may include: stacking a gate insulation layer and a gate layer on the substrate; patterning a gate electrode by patterning the gate insulation layer and the gate layer; forming the photoresist on the substrate and injecting p+ type impurity ion, so that a source electrode is formed; and removing the photoresist, forming the photoresist on the substrate again, and injecting n+ type impurity ion, so that a drain electrode is formed.

The step (h) may further include: patterning the area where the nanowires are located and then forming a trench by etching silicon oxide; and controlling a size of the cross-section of the nanowire by sacrificial oxidation and curing damage caused by the etching process.

The step (h) may further include: activating n+ or p+ type impurity ion through a heat treatment; and reducing a surface roughness of the nanowire by hydrogen annealing.

The substrate may be an intrinsic substrate.

DETAILED DESCRIPTION

The present invention will be described with reference to the accompanying drawings showing specific embodiments which can be embodied. The embodiments will be described enough for the present invention to be embodied by a skilled person in the art. Various embodiments of the present invention are different from each other and need not be mutually exclusive. For example, shape, structure and properties, which are described below, may be implemented in other embodiments without departing from the spirit of the present invention. Also, the position or placement of an individual component disclosed in each embodiment may be variously changed without departing from the spirit of the present invention. That is, the embodiment to be described below is just an example for understanding the present invention and is not intended to limit the structure, use, and application of the present invention. The description of the embodiment of the present invention can be understood with reference to the accompanying drawings. The accompanying drawings may be considered as a part of the description of the present invention.

Figure 1:
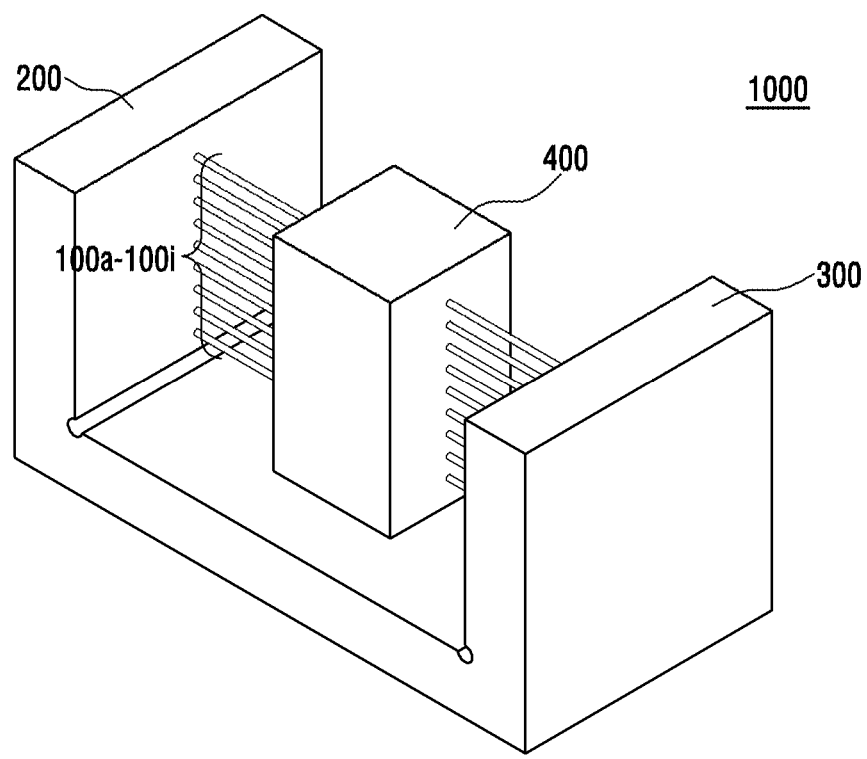
FIG. 1 is a perspective view of a tunneling field-effect transistor according to an embodiment of the present invention.

FIG. 1 is a perspective view of a tunneling field-effect transistor 1000 according to an embodiment of the present invention.

The tunneling field-effect transistor 1000 according to the embodiment of the present invention includes, as shown in FIG. 1, a plurality of nanowires 100a to 100i. While FIG. 1 shows that a total of nine nanowires are vertically stacked, the tunneling field-effect transistor 1000 may include more or fewer than nine nanowires. A source 200 and a drain 300 are formed on both ends of the nanowires 100a to 100i. A gate 400 is provided, which surrounds the plurality of vertically stacked nanowires 100a to 100i.

Here, the source 200 is formed by injecting p+ type impurity ion into a substrate 10. The drain 300 is formed by injecting n+ type impurity ion on the substrate 10. It is desirable that the substrate 10 should be an intrinsic substrate.

The plurality of nanowires 100a to 100i may be spaced at an equal interval, but are not limited to this. Also, each of the plurality of nanowires 100a to 100i can operate as an individual channel.

Hereinafter, a method for manufacturing the tunneling field-effect transistor 1000 according to the embodiment of the present invention will be described with reference to FIGS. 2A to 10.

Figure 2A:
FIGS. 2A, 2B, 2C, 2D, and 2E show a method for manufacturing the tunneling field-effect transistor according to the embodiment of the present invention.

First, as shown in FIG. 2A, the substrate 10 is provided. It is desirable that the provided substrate 10 should be an intrinsic substrate.

Figure 2B:
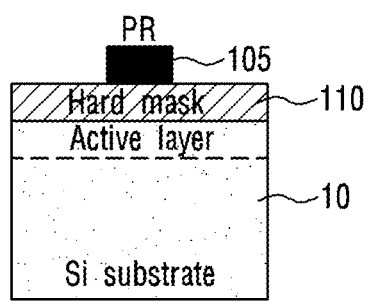

After the substrate 10 is provided, a hard mask 110 is, as shown in FIG. 2B, stacked and a photoresist 105 is patterned. As a result, the first nanowire 100a is ready to be formed.

Figure 2C:
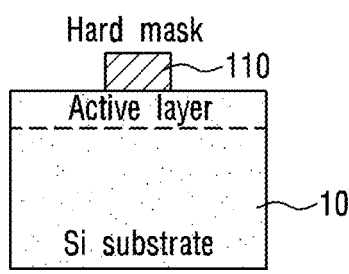

Subsequently, as shown in FIG. 2C, the hard mask 110 is etched by using the stacked photoresist 105 as a passivation layer, and then residual photoresist 105 is removed. FIG. 2C shows the state obtained by performing such a process.

Figure 2D:
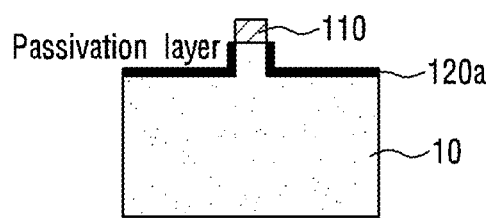

In the state where all the photoresist 105 is removed, an area to become the first nanowire 100a is, as shown in FIG. 2D, formed by anisotropic etching, and then a passivation layer 120a is formed.

Here, chlorine gas ($Cl_2$) may be used in the anisotropic etching. The passivation layer 120a may be made of polymer based $C_xF_y$ gases, for example, octafluorocyclobutane ($C_4F_8$) as one of them.

Figure 2E:
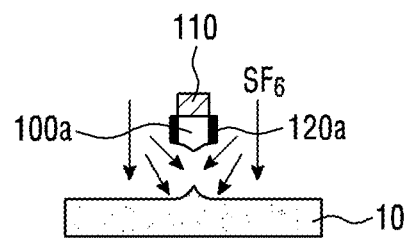

Next, as shown in FIG. 2E, the first nanowire 100a separated from the substrate 10 is formed by using isotropic etching. Here, sulphur hexafluoride ($SF_6$) may be used in the isotropic etching.

Figure 3A:
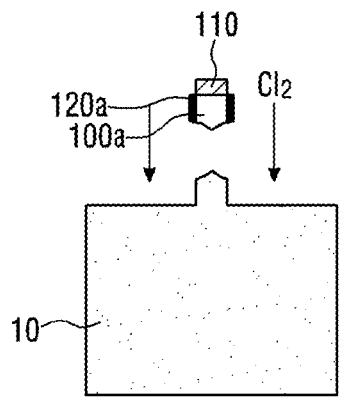
FIGS. 3A, 3B, and 3C show a method for manufacturing the tunneling field-effect transistor according to the embodiment of the present invention.
Figure 3B:
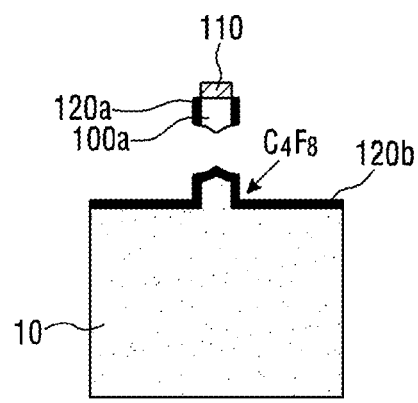
Figure 3C:
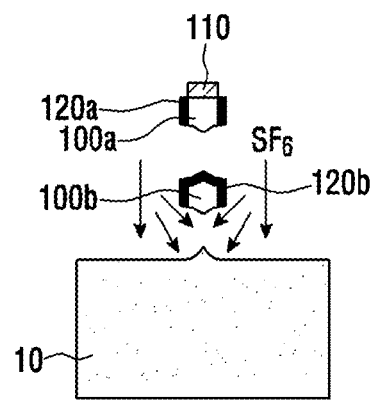

FIGS. 3A to 3C show a process of forming the second nanowire 100b below the first nanowire 100a formed by the process described above.

As shown in FIG. 3A, when the first nanowire 100a is formed, the anisotropic etching is performed again. Here, chlorine gas ($Cl_2$) may be used in the anisotropic etching.

In the next place, as shown in FIG. 3B, a passivation layer 120b is formed by using the polymer based octafluorocyclobutane ($C_4F_8$). Lastly, the isotropic etching is performed through use of the sulphur hexafluoride ($SF_6$). As a result, the second nanowire 100b is formed.

By performing such a process n times, n number of the vertically stacked nanowires are formed.

Figure 4A:
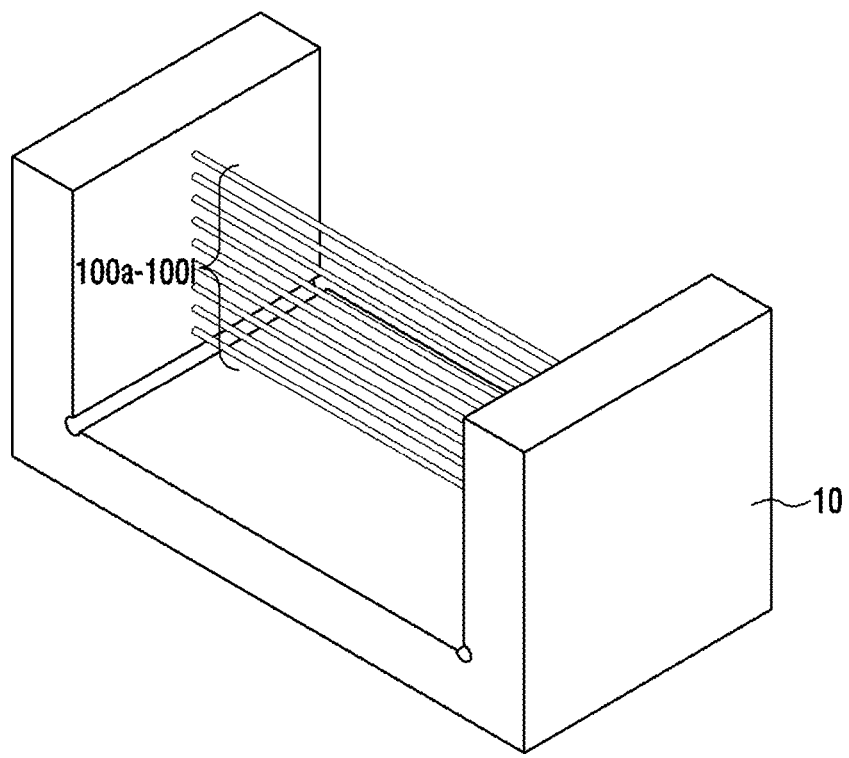
FIGS. 4A and 4B show schematically a structure of a vertically stacked nanowire of the tunneling field-effect transistor according to the embodiment of the present invention.
Figure 4B:
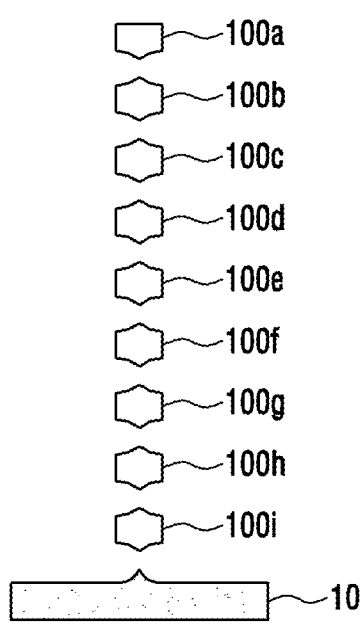
Figure 4C:
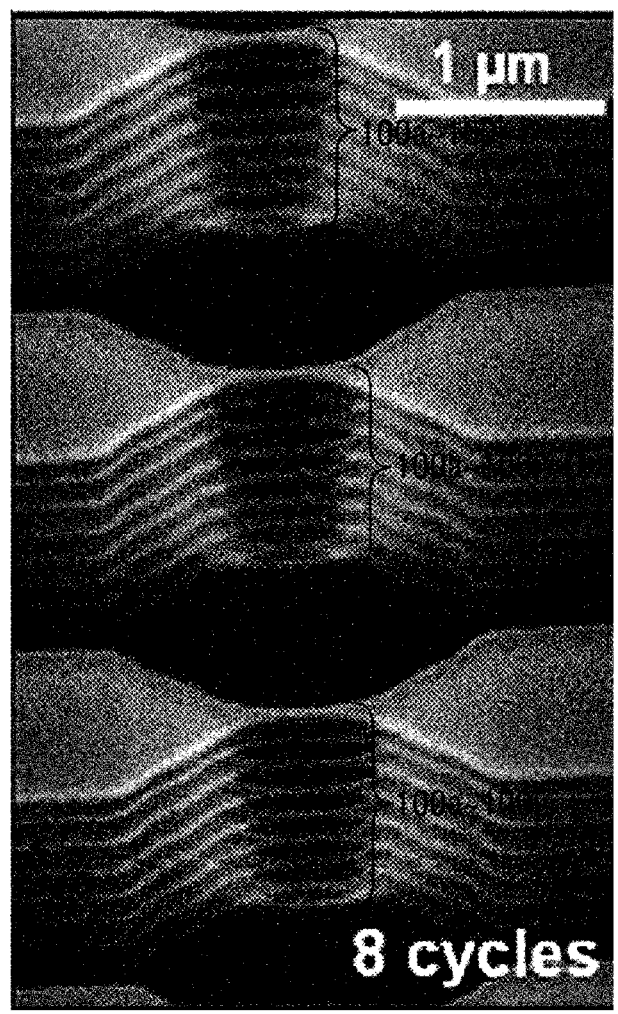
FIGS. 4C and 4D are electron microscope photographs of the vertically stacked nanowire of the tunneling field-effect transistor according to the embodiment of the present invention.
Figure 4D:
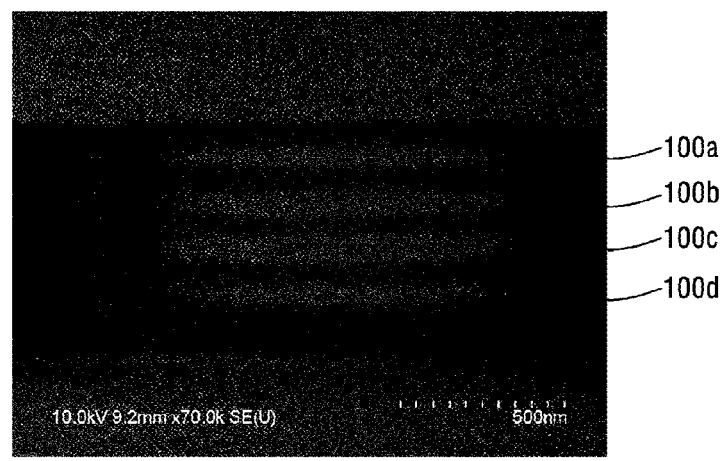

FIG. 4A is a perspective view showing the substrate in which a total of nine nanowires have been formed through the process described above. FIG. 4B is a cross sectional view of the nine vertically stacked nanowires. FIGS. 4C and 4D are electron microscope photographs thereof.

As shown in FIGS. 4A to 4D, it can be found that the nine vertically stacked nanowires 100a to 100i have been formed on the intrinsic substrate 10. Here, the numerical values mentioned in FIGS. 4C and 4D are just embodiments that can be implemented, and the present invention is not limited to the numerical values.

When the plurality of vertically stacked nanowires 100a to 100i are, as shown in FIGS. 4A to 4D, formed on the substrate, a gate electrode is patterned by patterning a gate insulation layer and a gate layer. Then, the photoresist is formed on the substrate and the p+ type impurity ion is injected, so that the source 200 is formed. After the source 200 is formed, the photoresist used in the formation of the source 200 is removed and another photoresist is formed in the area where the source 200 is located. Then, the n+ type impurity ion is injected into an area opposite to the area where the source 200 is located, so that the drain 300 is formed. In this way, the tunneling field-effect transistor 1000 is manufactured.

Hereinafter, the method for manufacturing the tunneling field-effect transistor 1000 according to the embodiment of the present invention will be described in more detail with reference to FIGS. 5 to 10.

Figure 5:
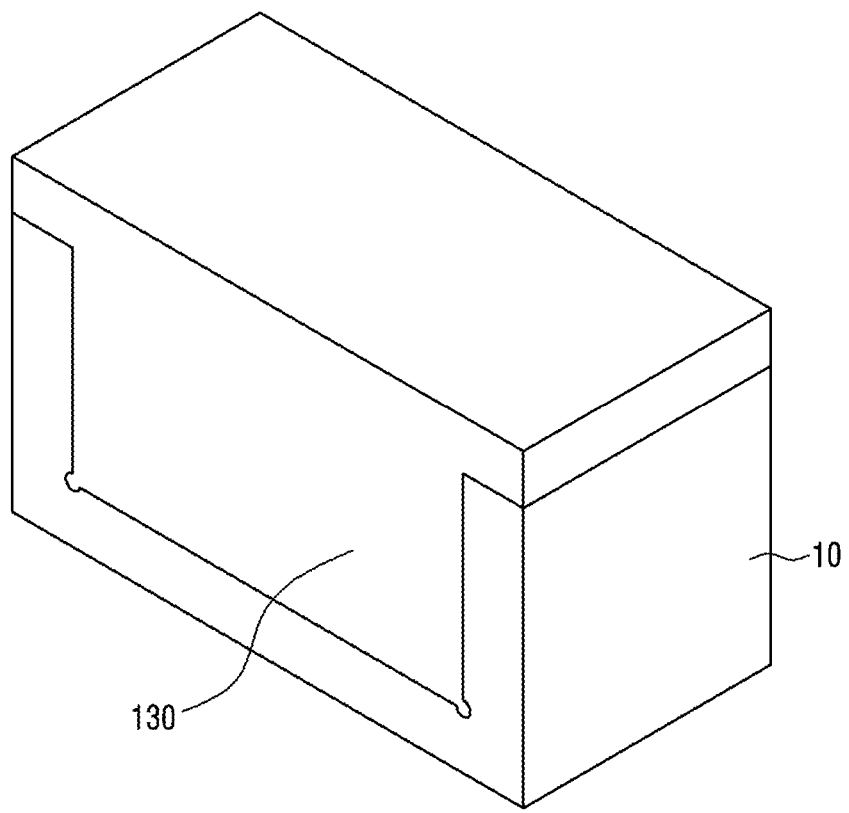
FIGS. 5, 6, 7, 8A, 8B, 9, 10, and 11 are views for describing the method for manufacturing the tunneling field-effect transistor according to the embodiment of the present invention.
Figure 6:
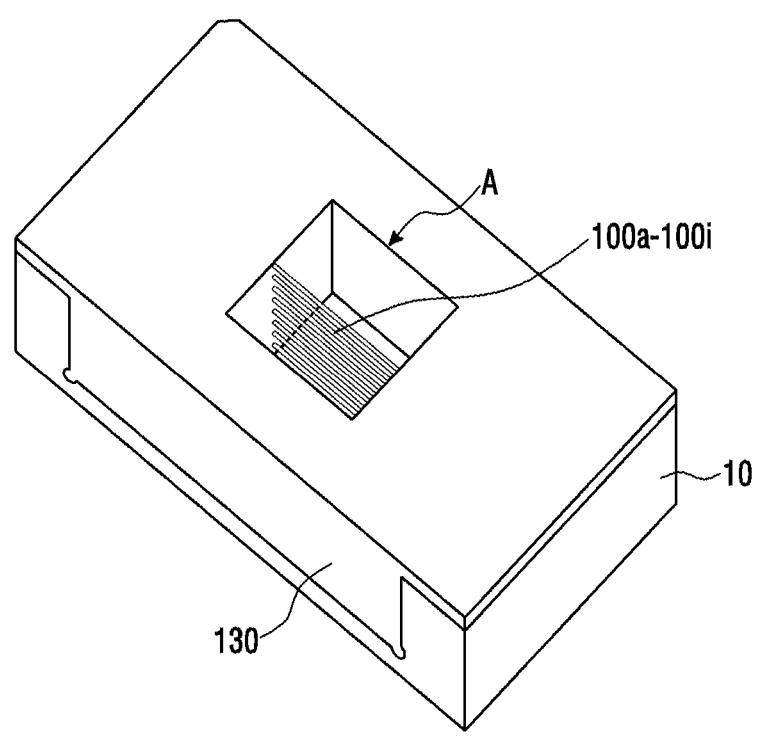

After the vertically stacked nanowires 100a to 100i are formed, silicon oxide 130 is deposited and a chemical-mechanical polishing process is performed. As a result, a shape shown in FIG. 5 is obtained.

Subsequently, the patterned photoresist is formed in the area where the vertically stacked nanowires 100a to 100i are located and the silicon oxide of the area exposed by the patterning of the photoresist is etched, so that a trench (area "A" of FIG. 6) is formed. As a result, the area where the vertically stacked nanowires 100a to 100i are located is exposed.

Then, there may be further steps of removing the photoresist and controlling the size of the cross-section of the vertically stacked nanowires 100a to 100i by sacrificial oxidation, and of curing damage caused by the etching process.

Figure 7:
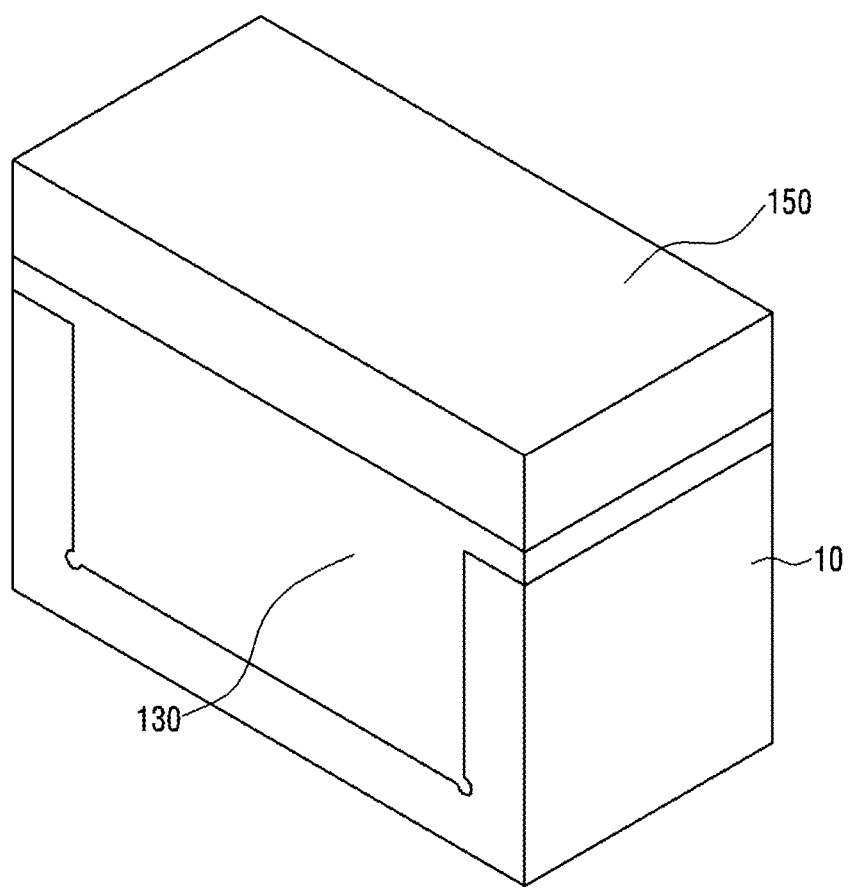

Subsequently, as shown in FIG. 7, a gate insulation layer silicon oxide 130 is formed on the nanowire exposed by the formation of the trench "A", and a gate layer 150 is formed on the silicon oxide 130.

Here, the gate insulation layer 140 may be a silicon oxide layer or a high-K. More specifically, the gate insulation layer 140 may be made of silicon oxide, a nitride film, aluminum oxide, hafnium oxide, hafnium oxynitride, zinc oxide, lanthanum oxide, hafnium silicon oxide, etc. However, the material of the gate insulation layer 140 is not limited to these materials.

Meanwhile, the gate layer 150 may be made of a metal silicon or polysilicon. That is, the gate layer 150 may be made of polysilicon and a metallic material such as Al, Mo, Mg, Cr, Pd, Au, Pt, and Ti. However, the present invention is not limited to these materials.

Figure 8A:
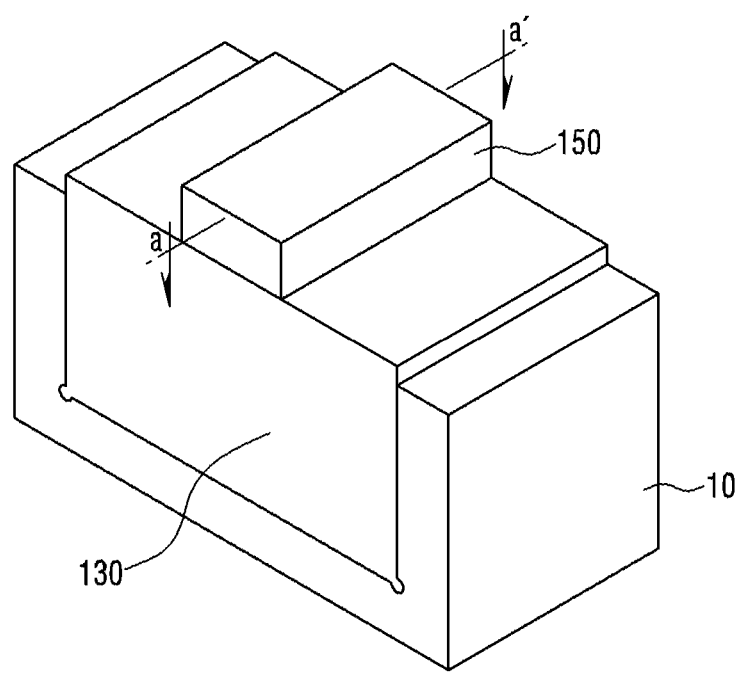

Then, FIG. 8A shows a result obtained by patterning the silicon oxide 130 and the gate layer 150 through a photolithography process. Here, the source and the drain are formed in the areas to be removed of the silicon oxide 130 and the gate layer 150. Therefore, in consideration of this, the patterning is appropriately performed.

Figure 8B:
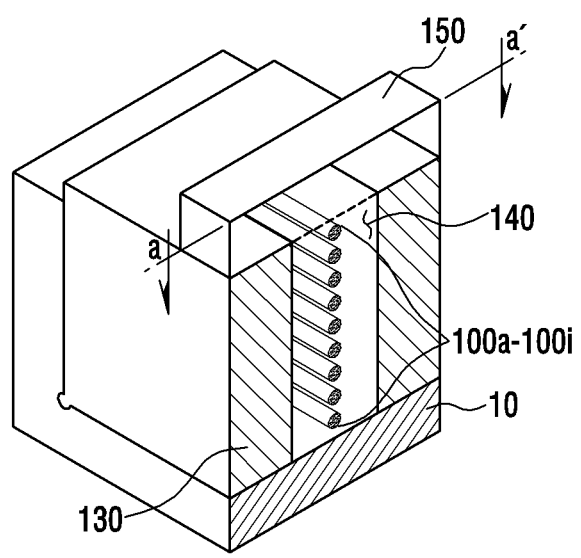

FIG. 8B is a cross sectional view taken along line a-a' of FIG. 8A. As shown in FIG. 8B, the gate insulation layer 140 exists in the area where the plurality of nanowires 100a to 100i have been vertically stacked. The silicon oxide 130 is formed on both sides of the area where the plurality of nanowires 100a to 100i have been vertically stacked.

Figure 9:
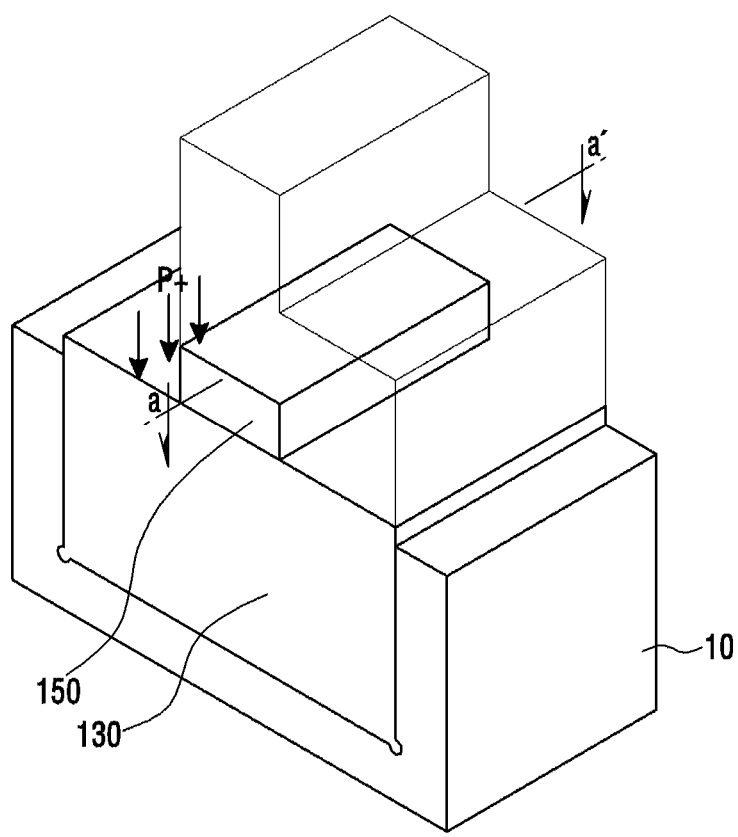
Figure 10:
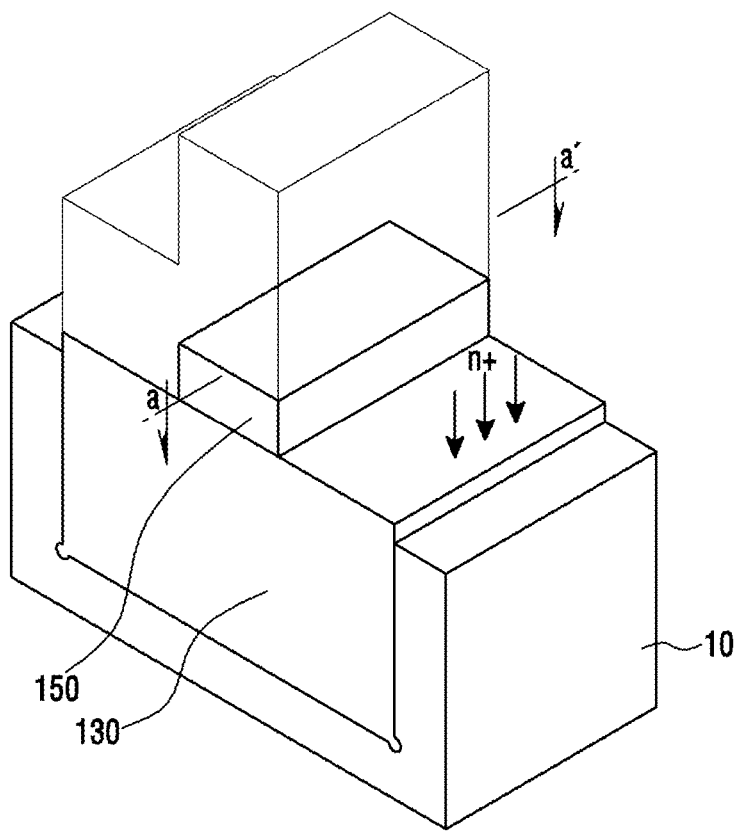

Subsequently, as shown in FIG. 9, the photoresist 105 is patterned again on some areas of the gate layer 150 and the substrate 10 (the area where the drain 300 is to be formed), and high density p+ type impurity ion (group III elements of the periodic table) is injected into the area where the photoresist 105 does not exist (the area where the source 200 is to be formed).

After the photoresist 105 is removed, the photoresist 105 is, as shown in FIG. 10, patterned again on some areas of the gate layer 150 and the substrate 10 (the area where the source 200 is to be formed), and high density n+ type impurity ion (group V elements of the periodic table) is injected into the area where the photoresist 105 does not exist (the area where the drain 300 is to be formed).

Figure 11:
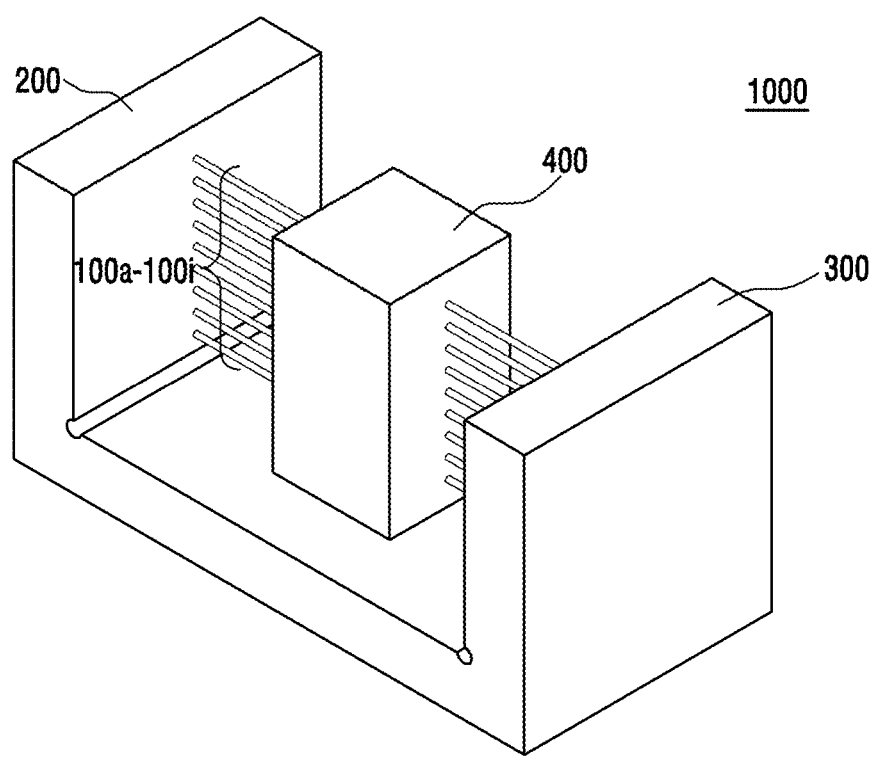

FIG. 11 shows the thus manufactured tunneling field-effect transistor 1000. When the intrinsic substrate 10 is heat-treated and the injected ions are activated, the areas of the source 200 and the drain 300 form a junction area. Here, in lieu of the polysilicon into which high density n-type ion (group V elements of the periodic table) has been injected, a metallic material may be used as the gate layer.

Lastly, the surface roughness of the vertically stacked nanowires 100a to 100i is reduced by hydrogen annealing.

According to the method for manufacturing the tunneling field-effect transistor 1000 according to the embodiment of the present invention, it is possible to generate a higher driving current without changing the length of the gate and the area of the channel (degree of integration).

Further, according to a method for forming a front gate electrode through the formation of the trench, it is possible to easily deposit and etch a gate material and thus to stably form the electrode. In accordance with the above, not only current reduction according to the mobility reduction caused by surface roughness scattering can be overcome by multi-channel, but also the performance of the device can be improved by inhibiting short channel effect.

Figure 12:
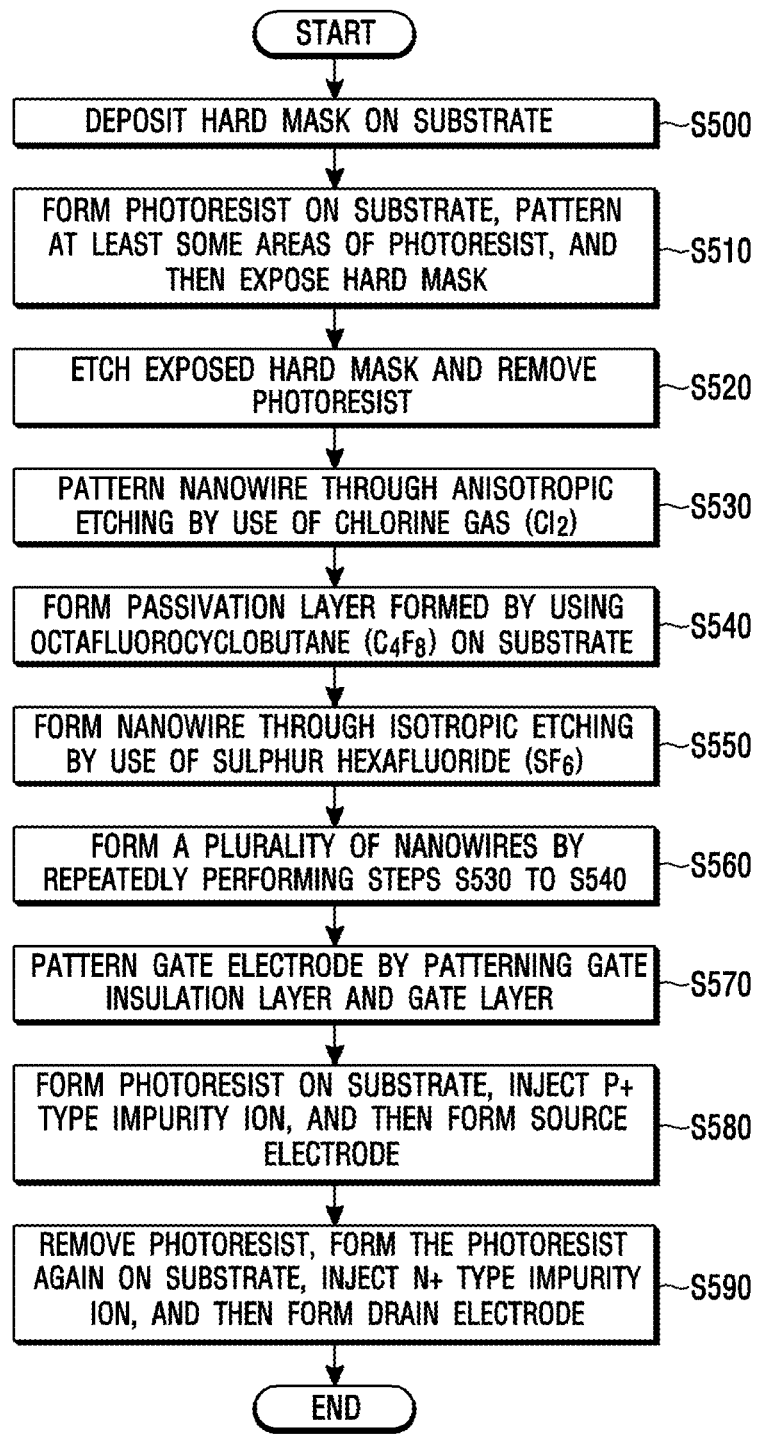
FIG. 12 is a flowchart showing the method for manufacturing the tunneling field-effect transistor according to the embodiment of the present invention.

FIG. 12 is a flowchart showing the method for manufacturing the tunneling field-effect transistor 1000 according to the embodiment of the present invention.

First, the hard mask is deposited on the intrinsic substrate (S500) and the photoresist is formed. Then, some areas of the photoresist are patterned and the hard mask is exposed (S510). The patterned some areas are intended to remove unnecessary hard mask.

The hard mask of the some areas, which is exposed by the photoresist, is etched and the photoresist is removed (S520).

It is in the remaining hard mask area that the plurality of vertically stacked nanowires 100a to 100i are subsequently formed.

Then, the first nanowire is patterned through the anisotropic etching by use of the chlorine gas ($Cl_2$). According to dry etching using the chlorine gas ($Cl_2$), the etching is performed in a vertical direction to the surface of the substrate 10. Here, although the chlorine gas ($Cl_2$) is assumed to be used, chemically active gas such as a halide, etc., other than the chlorine gas ($Cl_2$) can be used in another embodiment.

When a side of the first nanowire is patterned by the anisotropic etching in a direction perpendicular to the intrinsic substrate, the passivation layer is formed on the substrate 10. Here, the passivation layer may be formed by using octafluorocyclobutane ($C_4F_8$). Besides, another material having a function of the passivation layer can be also used and be appropriately selected by a skilled person in the art.

After the passivation layer is formed, the isotropic etching is performed (S550). The isotropic etching has the same etch rate with respect to every direction, thereby allowing the bottom surface of the nanowire to be formed. Sulphur hexafluoride ($SF_6$) may be used in the isotropic etching. As such, the anisotropic etching, the passivation, and the isotropic etching are performed in the order listed, so that the first nanowire is formed.

Meanwhile, when the steps S530 to S550 are repeatedly performed n times, n number of the vertically stacked nanowires may be vertically stacked at a predetermined spaced distance.

Then, the gate insulation layer and the gate layer are stacked and patterned, so that the gate electrode is formed (S570).

Subsequently, the photoresist is formed on the gate layer and the substrate. Specifically, the photoresist is patterned on some areas of the substrate, and high density p+ type impurity ion (group III elements of the periodic table) is injected into the area where the photoresist does not exist, so that a source electrode is formed (S580).

Then, after the photoresist is removed and is patterned again on the substrate, high density n+ type impurity ion is injected into the area where the photoresist does not exist, so that a drain electrode is formed (S590). As a result, the tunneling field-effect transistor according to the embodiment of the present invention is manufactured.

Figure 13:
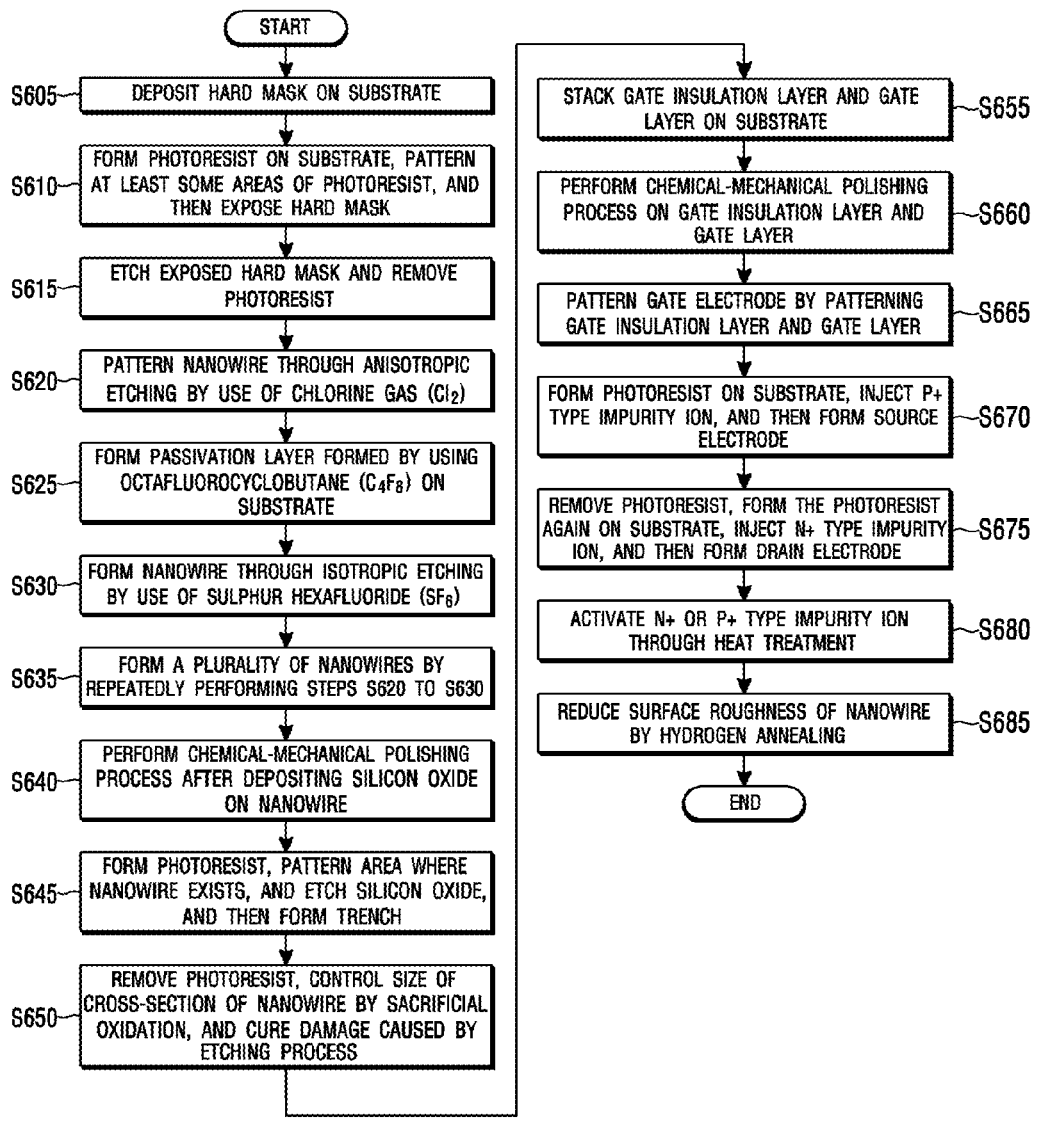
FIG. 13 is a flowchart showing a method for manufacturing the tunneling field-effect transistor according to another embodiment of the present invention.
Figure 14A:
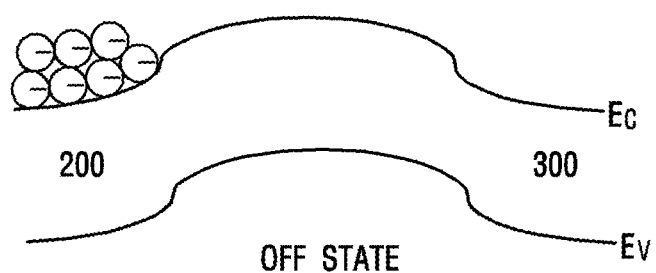
FIGS. 14A and 14B are views schematically showing a drift mechanism of MOSFET.
Figure 14B:
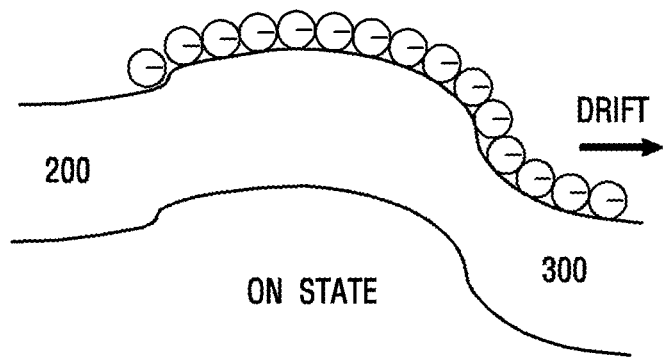
Figure 15A:
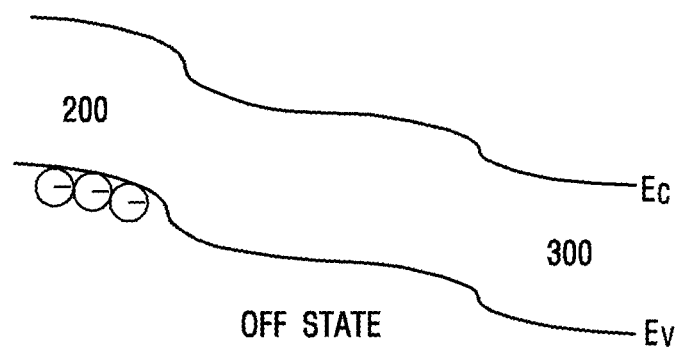
FIGS. 15A and 15B are views schematically showing a tunneling mechanism of TFET.
Figure 15B:
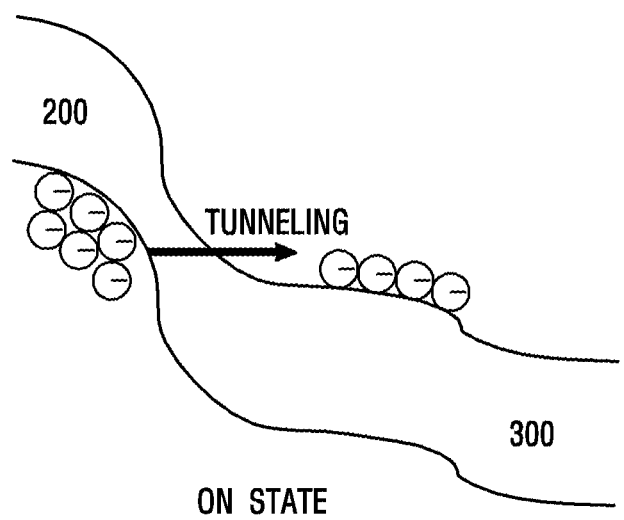

FIG. 13 is a flowchart showing in more detail the method for manufacturing the tunneling field-effect transistor according to the embodiment of the present invention. Since steps S605 to S635 are the same as the steps S500 to S560 of FIG. 12, descriptions thereof will be omitted.

When the plurality of vertically stacked nanowires are formed by repeatedly performing steps S620 to S630 (S635), the silicon oxide is deposited on the nanowire and a chemical-mechanical polishing process is performed (S640).

Subsequently, the photoresist is formed and the area where the nanowire exists is patterned. Then, the silicon oxide is etched, and thus, a trench is formed (S645). Here the trench refers to the area "A" of FIG. 6 and means a hollow to expose only the vertically stacked nanowire.

Then, the photoresist is removed and the size of the cross-section of the nanowire by sacrificial oxidation is controlled, and then damage caused by the etching process is cured (S650).

Next, the gate insulation layer is stacked on the trench, and then the gate layer is stacked on the gate insulation layer. This process is sequentially performed (S655). Also, a chemical-mechanical polishing process is performed on the gate insulation layer and the gate layer (S660).

The gate insulation layer and the gate layer, on which the chemical-mechanical polishing process has been performed, are patterned, so that the gate electrode is formed (S665).

Then, the photoresist is formed on the gate layer and the substrate. Specifically, the photoresist is patterned on some areas of the substrate, and high density p+ type impurity ion (group III elements of the periodic table) is injected into the area where the photoresist does not exist, so that the source electrode is formed (S670).

Then, after the photoresist is removed and is patterned again on the substrate, high density n+ type impurity ion is injected into the area where the photoresist does not exist, so that the drain electrode is formed (S675). When the source, drain, and gate electrodes are formed in this way, the n+ or p+ type impurity ion is activated (S680) through a heat treatment. Lastly, the surface roughness of the nanowire is reduced by hydrogen annealing (S685). As a result, the tunneling field-effect transistor according to the embodiment of the present invention 1000 is manufactured.

Here, some of steps S640 to S690 may be omitted. Another step may be added if necessary.

According to the embodiment of the present invention, it is possible to manufacture the tunneling field-effect transistor including the front gate vertically stacked silicon nanowires having the non-junction structure. Therefore, it is possible not only to efficiently control the short channel effect caused by the miniaturization of the device, but also to generate a higher driving current without changing the length of the gate and the area of the channel (degree of integration).

While the above description and accompanying drawings show possible embodiments of the present invention, the scope of the present invention is defined only by the appended claims. That is, various additions, transformations, and substitutions can be made without departing from the scope and spirit disclosed in the claims of the present invention. Also, the present invention can be implemented by other particular shapes, structures, arrangements, components, and sizes or implemented by adding other factors, materials, and parts. Also, it will be apparent to those skilled in the art that the embodiment of the present invention can be adapted to a specific environment or operating condition without departing from a basic principle of the present invention.

What is claimed is:

1. A method for manufacturing a tunneling field-effect transistor, the method comprising:
   (a) depositing a hard mask on a substrate;
   (b) forming a photoresist on the substrate and exposing the hard mask by patterning at least one portion of the photoresist;
   (c) etching the exposed hard mask and removing the photoresist;
   (d) patterning a first channel on the substrate by using anisotropic etching;
   (e) forming a first passivation layer on the substrate;
   (f) forming a first nanowire separated from the substrate by using isotropic etching;
   (g) patterning a second channel, beneath the first nanowire, on the substrate by using anisotropic etching;
   (h) forming a second passivation layer on the substrate;
   (i) forming a second nanowire separated from the first nanowire and the substrate by using isotropic etching; and
   (j) manufacturing the tunneling field-effect transistor comprising the first nanowire and the second nanowire.

2. The method for manufacturing a tunneling field-effect transistor as claimed in claim 1, wherein the step (j) comprises:
   stacking a gate insulation layer and a gate layer on the substrate;
   patterning a gate electrode by patterning the gate insulation layer and the gate layer;
   forming the photoresist on the substrate and injecting p+ type impurity ion, so that a source electrode is formed; and
   removing the photoresist, forming the photoresist on the substrate again, and injecting n+ type impurity ion, so that a drain electrode is formed.

3. The method for manufacturing a tunneling field-effect transistor as claimed in claim 2, wherein the step (j) further comprises:
   patterning the area where the nanowires are located and then forming a trench by etching silicon oxide; and
   controlling a size of the cross-section of the nanowire by sacrificial oxidation and curing damage caused by the etching process.

4. The method for manufacturing a tunneling field-effect transistor as claimed in claim 2, wherein the step (j) further comprises:
   activating n+ or p+ type impurity ion through a heat treatment; and
   reducing a surface roughness of the nanowire by hydrogen annealing.

5. The method for manufacturing a tunneling field-effect transistor as claimed in claim 1, wherein the substrate is an intrinsic substrate.

* * * * *